US010418208B2

(12) United States Patent
Liao et al.

(10) Patent No.: US 10,418,208 B2
(45) Date of Patent: Sep. 17, 2019

(54) HOUSEHOLD APPLIANCE AND CONTROL ASSEMBLY THEREOF

(71) Applicant: WUXI LITTLE SWAN COMPANY LIMITED, Wuxi (CN)

(72) Inventors: Wenjing Liao, Wuxi (CN); Mingchao Sun, Wuxi (CN); Zhixia Song, Wuxi (CN)

(73) Assignee: WUXI LITTLE SWAN COMPANY LIMITED, Wuxi, Jiangsu (CN)

( * ) Notice: Subject to any disclaimer, the term of this patent is extended or adjusted under 35 U.S.C. 154(b) by 0 days.

(21) Appl. No.: 16/030,743

(22) Filed: Jul. 9, 2018

(65) Prior Publication Data

US 2019/0115172 A1 Apr. 18, 2019

(30) Foreign Application Priority Data

Oct. 12, 2017 (CN) .......................... 2017 1 0947424

(51) Int. Cl.

| | |
|---|---|
| ***H01H 21/86*** | (2006.01) |
| ***H01H 21/02*** | (2006.01) |
| ***H05K 5/00*** | (2006.01) |
| ***H01H 21/24*** | (2006.01) |

(52) U.S. Cl.

CPC .......... *H01H 21/86* (2013.01); *H01H 21/025* (2013.01); *H01H 21/245* (2013.01); *H05K 5/0017* (2013.01); *H01H 2231/012* (2013.01); *H01H 2231/016* (2013.01)

(58) Field of Classification Search

CPC .... H01H 21/86; H01H 21/245; H01H 21/025; H01H 2231/012; H01H 2231/016; H05K 5/0017

See application file for complete search history.

(56) References Cited

U.S. PATENT DOCUMENTS

| | | | | |
|---|---|---|---|---|
| 6,682,161 B2 * | 1/2004 | Yun | ........................ | F16M 11/10 16/334 |
| 6,692,093 B1 * | 2/2004 | Park | ........................ | F16M 11/10 312/319.7 |
| 2006/0061695 A1 * | 3/2006 | Endo | ................ | G02F 1/133308 348/739 |
| 2007/0113594 A1 * | 5/2007 | Ahn | ...................... | D06F 39/005 68/3 R |

(Continued)

*Primary Examiner* — Abhishek M Rathod

(74) *Attorney, Agent, or Firm* — Morgan, Lewis & Bockius LLP

(57) ABSTRACT

The present disclosure provides a household appliance and a control assembly which includes a control panel, a display screen and a power switch. The display screen is arranged on the control panel and can move relative to the control panel. The power switch is connected to the control panel and/or the display screen for controlling the power-on and power-off of the household appliance. When the display screen is pressed, the display screen moves relative to the control panel and controls the power-on or power-off of the power switch. By pressing the display screen to control the power-on and power-off of the power switch, a complete power-off can be achieved to eliminate the drawbacks of weak power and incomplete power-off of the touch-sensitive power switch, and the arrangement of a power switch key is omitted, therefore the operation and the overall appearance of the household appliance is simplified.

16 Claims, 5 Drawing Sheets

(56) References Cited

U.S. PATENT DOCUMENTS

| | | | | |
|---|---|---|---|---|
| 2012/0181304 | A1* | 7/2012 | Kim | F25D 23/126 222/182 |
| 2013/0176663 | A1* | 7/2013 | Liao | G06F 1/1616 361/679.01 |
| 2015/0253818 | A1* | 9/2015 | Wong | G06F 1/182 361/679.44 |
| 2016/0281994 | A1* | 9/2016 | Nuessler | A47L 15/42 |
| 2018/0116072 | A1* | 4/2018 | Mozer | H05K 7/1412 |

* cited by examiner

HOUSEHOLD APPLIANCE AND CONTROL ASSEMBLY THEREOF

PRIORITY CLAIM AND RELATED APPLICATION

This application claims priority to Chinese Patent Application No. 201710947424.2, entitled "HOUSEHOLD APPLIANCE AND CONTROL ASSEMBLY THEREOF" filed on Oct. 12, 2017, which is hereby incorporated by reference in its entirety.

TECHNICAL FIELD

The present disclosure relates to the field of household appliances, and more particularly to a control assembly and a household appliance including the control assembly.

BACKGROUND

With respect to existing household appliances such as a washing machine, its power switch control part is an independent physical key, a power switch is independently arranged on the surface of a control panel of the washing machine, which is the same as the traditional mode and affects the overall appearance, and a user needs to turn on the power switch on the rightmost end first when operating the washing machine, and then the user needs to move a hand to a screen for program selection, such an operation is cumbersome and inconvenient. Some washing machines use a touch-sensitive power switch, which has drawbacks of weak power and incomplete power off. Moreover, such a power switching mode is traditional, and the appearance of the washing machine is not straightforward, thus affecting the user experience.

SUMMARY

The present disclosure aims at solving at least one of the technical problems existing in the prior art.

To this end, an objective of one aspect of the present disclosure is to provide a control assembly.

An objective of another aspect of the present disclosure is to provide a household appliance including the above control assembly.

To achieve the above objectives, the embodiment of one aspect of the present disclosure provides a control assembly for a household appliance. The control assembly includes: a control panel; a display screen arranged on the control panel and capable of moving relative to the control panel; and a power switch connected to the control panel and/or the display screen and used for controlling the power-on and power-off of the household appliance; wherein when the display screen is pressed, the display screen moves relative to the control panel and controls the power-on or power-off of the power switch.

According to the control assembly provided by the above embodiment of the present disclosure, the display screen is movably connected to the control panel, so that the display screen can move relative to the control panel, and when the display screen is pressed, the display screen moves relative to the control panel and controls the power-on or power-off of the power switch so as to control the power-on and power-off of the household appliance, namely, control the power-on and power-off of the display screen. By pressing the display screen to control the power-on and power-off of the power switch, complete power-off can be achieved to eliminate the drawbacks of weak power and incomplete power-off of the touch-sensitive power switch, and the arrangement of a power switch key is omitted, therefore the operation is simplified, the drawback of cumbersome operations of a physical key type power switch is eliminated, the overall appearance of the household appliance is simplified and suitable for high-end products. The brand new method of power-on and power-off is more attractive to consumers and makes the user experience more novel and more unique, which is different from that of the existing products on the market.

In addition, the control assembly provided by the above embodiment of the present disclosure also has the following additional technical features:

In the above technical solution, preferably, the control assembly further includes: a rebound self-locking device including a rebound self-locking device body and a clamping hook capable of engaging the rebound self-locking device body, wherein the rebound self-locking device body is arranged on one of the control panel and the display screen, the clamping hook is arranged on the other of the control panel and the display screen, and when the display screen is pressed, the display screen moves relative to the control panel and drives the rebound self-locking device body to engage or disengage the clamping hook.

The clamping hook is arranged on a surface (the surface opposite to the control panel) of the display screen close to the control panel, and the rebound self-locking device body is arranged on a surface (the surface opposite to the display screen) of the control panel close to the display screen, and the rebound self-locking device body and the clamping hook are correspondingly arranged, or the rebound self-locking device body is arranged on the surface (the surface opposite to the control panel) of the display screen close to the control panel, the clamping hook is arranged on the surface (the surface opposite to the display screen) of the control panel close to the display screen, and the rebound self-locking device body and the clamping hook are correspondingly arranged.

When the display screen is pressed, preferably, when the display screen is pressed toward the control panel, the clamping hook cooperates with the rebound self-locking device body to achieve the self-locking of the rebound self-locking device, at this time, the power switch is turned on, and when the display screen is pressed again (preferably, when the display screen is pressed toward the control panel again), the rebound self-locking device body separates from the clamping hook to achieve rebound unlocking, thus driving the display screen to move toward a direction opposite to the pressed direction so that the power switch is turned off.

In the above technical solution, preferably, the display screen is rotatably connected to the control panel.

The display screen is rotatably connected to the control panel through a rotating shaft. Specifically, the rotating shaft is arranged on one of the display screen and the control panel, a shaft hole matched with the rotating shaft is formed in the other of the display screen and the control panel, and the rotating shaft is inserted into the shaft hole to achieve the rotatable connection between the display screen and the control panel. Alternatively, a first shaft hole and a second shaft hole matched with the rotating shaft are respectively formed in the display screen and the control panel, and the rotating shaft penetrates through the first shaft hole and the second shaft hole to achieve the rotatable connection between the display screen and the control panel.

The rotatable connection mode between the display screen and the control panel facilitates the pressing of the user on the display screen, and when the display screen is pressed, the display screen can smoothly move relative to the control panel.

In the above technical solution, preferably, the control panel includes a mounting part, the mounting part is arranged along a vertical direction or is arranged obliquely, and the display screen is rotatably connected to the mounting part.

In the above technical solution, preferably, a lower end or an upper end of the display screen is rotatably connected to the mounting part.

Preferably, the household appliance further includes a top cover plate, the top cover plate is horizontally arranged and is located above the control panel, the control panel is connected to the edge of the top cover plate, the mounting part on the control panel is vertically or obliquely arranged, and preferably, and the mounting part gradually inclines toward the outside of the household appliance along a top-down direction. When the upper end of the display screen is rotatably connected to the mounting part, the movement of the display screen relative to the control panel can be achieved after the lower end of the display screen is pressed. Alternatively, when the lower end of the display screen is rotatably connected to the mounting part, the movement of the display screen relative to the control panel can be achieved after the upper end of the display screen is pressed. The press mode of pressing the upper end or the lower end of the display screen satisfies the use habits of most consumers.

Of course, the mounting part can also be arranged horizontally.

In the above technical solution, preferably, the display screen is slidably connected to the control panel, wherein a slide rail is arranged on the display screen, and a chute matched with the slide rail is formed in the control panel, alternatively, a chute is formed in the display screen, and a slide rail matched with the chute is arranged on the control panel.

The cooperation of the slide rail and the chute forms a guide mechanism, so that when the display screen is pressed, it can move relative to the control panel along the guide mechanism. When the display screen is pressed, the display screen moves relative to the control panel toward a direction (inward) close to the axial line of the household appliance, the movement of the display screen drives the power switch to be turned on and drives the rebound self-locking device to achieve self-locking, and when the display screen is pressed again, the rebound self-locking device unlocks and drives the display screen to move outward along the guide mechanism so that the power switch is turned off.

In the above technical solution, preferably, an elastic member is supported between the control panel and the display screen.

The elastic member can provide a supporting force for the rebound of the display screen and can also provide an elastic force ensuring a pressing stroke of the display screen. Specifically, when the display screen is pressed, the elastic member is compressed, and when the display screen is pressed again, the rebound self-locking device achieves unlocking. Since the elastic member is compressed, the elastic member and the rebound self-locking device jointly drive the display screen to reset, and when the display screen is pressed, the elastic member can cause the display screen to move smoothly relative to the control panel.

In the above technical solution, preferably, one end of the elastic member is connected to the display screen, a mounting seat is arranged on the surface of the control panel opposite to the display screen, the mounting seat is provided with a mounting groove or a mounting column thereon, and the other end of the elastic member is located in the mounting groove or is sleeved on the mounting column; alternatively, one end of the elastic member is connected to the control panel, the mounting seat is arranged on the surface of the display screen opposite to the control panel, the mounting seat is provided with a mounting groove or a mounting column thereon, and the other end of the elastic member is located in the mounting groove or is sleeved on the mounting column.

In the above technical solution, preferably, the power switch is a contact switch, which includes a first contact arranged on the display screen and a second contact arranged on the control panel and corresponding to the first contact, and when the display screen is pressed, the display screen moves relative to the control panel and drives the first contact and the second contact to engage or disengage each other so as to control the power-on or power-off of the power switch; alternatively, the power switch is a micro switch, which is arranged on the display screen or the control panel; and/or an accommodating groove with one open end is formed in the control panel, and the display screen is located in the accommodating groove and covers the open end of the accommodating groove.

The embodiment of the second aspect of the present disclosure provides a household appliance, including the control assembly described in any one of the above embodiments.

The embodiment of the second aspect of the present disclosure includes the control assembly described in the embodiment of the first aspect, thus having all beneficial effects of the control assembly described in the embodiment of the first aspect, therefore it is not described repeatedly herein.

In the above technical solution, preferably, the household appliance is a washing machine, a clothes dryer, a rice cooker, a pressure cooker or a food processor.

Additional aspects and advantages of the present disclosure will become apparent in the following description, or may be learned by the practice of the present disclosure.

BRIEF DESCRIPTION OF THE DRAWINGS

The above and/or additional aspects and advantages of the present disclosure will become apparent and easily understood from the following description of embodiments in conjunction with the drawings, wherein.

Figure 1:
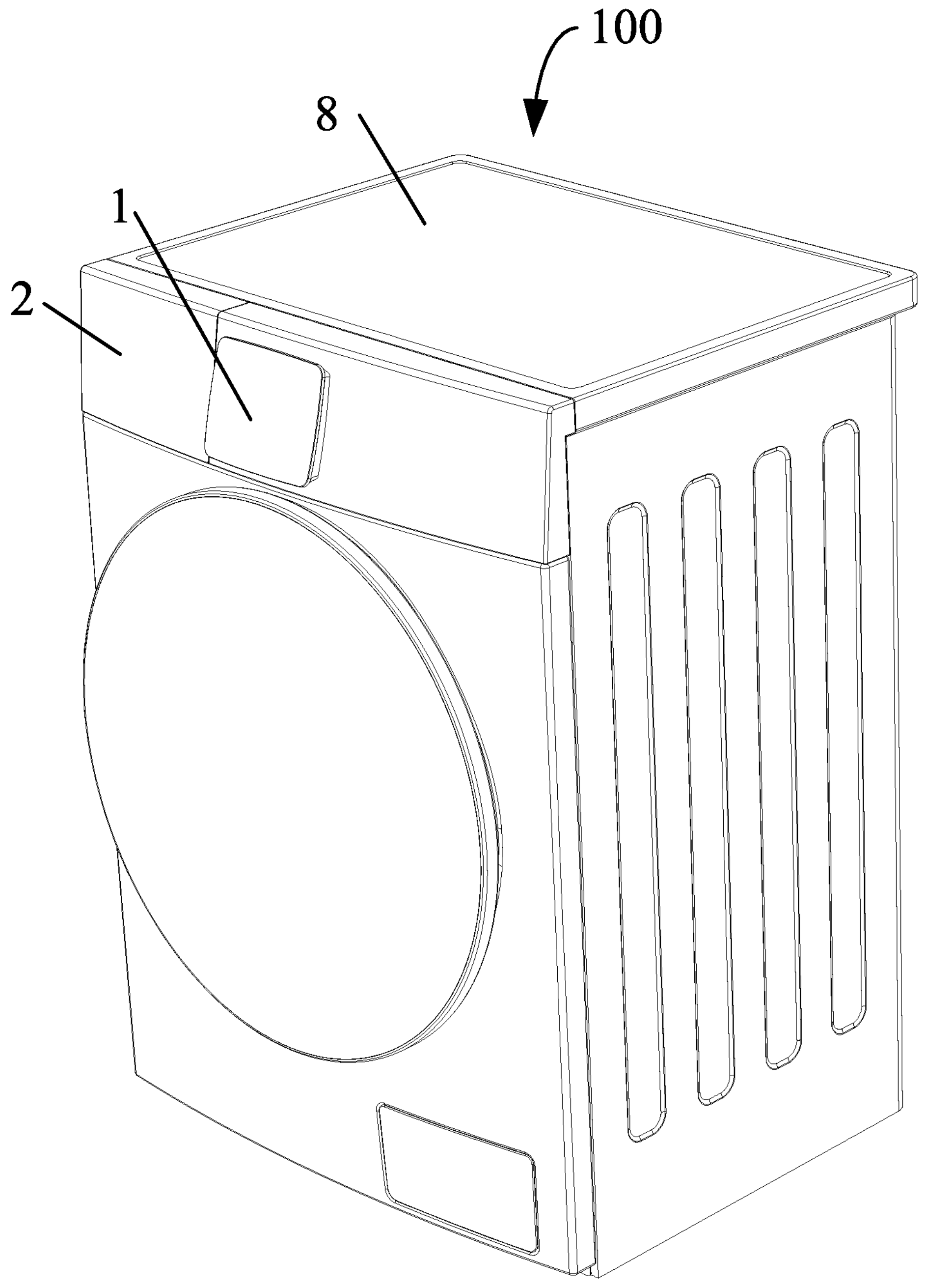
FIG. 1 is a structural schematic diagram of one view angle of a household appliance in a first embodiment of the present disclosure.

The corresponding relation between reference signs and component names in FIGS. 1 to 5 is as follows:

100: household appliance, 1: display screen, 2: control panel, 21: mounting part, 3: rebound self-locking device, 31: rebound self-locking device body, 32: clamping hook, 4: contact switch, 41: first contact, 42: second contact, 5: elastic member, 6: mounting seat, 61: mounting groove, 7: rotating shaft, and 8: top cover plate.

DETAILED DESCRIPTION OF THE EMBODIMENTS

In order to more clearly understand the above objectives, features and advantages of the present disclosure, the present disclosure will be further described in detail below in conjunction with the drawings and specific embodiments. It should be noted that the embodiments of the present application and the features in the embodiments can be combined with each other without conflict.

In the following description, numerous specific details are set forth in order to fully understand the present disclosure. However, the present disclosure can also be implemented in other ways than those described herein. Therefore, the protection scope of the present disclosure is not limited to the specific embodiments disclosed below.

Hereinafter, the control assembly and the household appliance according to some embodiments of the present disclosure will be described with reference to FIGS. 1 to 5, and a washing machine is used as an example for illustration. Of course, the household appliance in the present application can also be a clothes dryer, a rice cooker, a pressure cooker, a food processor or the like in addition to the washing machine.

As shown in FIGS. 1 to 5, a control assembly provided according to some embodiments of the present disclosure is used for a household appliance 100, and the control assembly includes a control panel 2, a display screen 1 and a power switch. The display screen 1 is arranged on the control panel 2 and can move relative to the control panel 2; the power switch is connected to the control panel 2 and/or the display screen 1 and is used for controlling the power-on and power-off of the household appliance 100; wherein when the display screen 1 is pressed, the display screen 1 moves relative to the control panel 2 and controls the power-on or power-off of the power switch.

According to the control assembly provided by the above embodiment of the present disclosure, the display screen 1 is movably connected to the control panel 2, so that the display screen 1 can move relative to the control panel 2, and when the display screen 1 is pressed, the display screen 1 moves relative to the control panel 2 and controls the power-on or power-off of the power switch so as to control the power-on and power-off of the household appliance 100, namely, control the power-on and power-off of the display screen 1. Specifically, when the power switch is turned on, the household appliance is power on, and when the power switch is turned off, the household appliance is power off; of course, also possibly, when the power switch is turned off, the household appliance is power on, and when the power switch is turned on, the household appliance is power off, which is specifically determined by a control circuit of the household appliance. By pressing the display screen 1 to control the power-on and power-off of the power switch, complete power-off can be achieved to eliminate the drawbacks of weak power and incomplete power-off of the touch-sensitive power switch, and the arrangement of a power switch key is omitted, therefore the operation is simplified, the drawback of cumbersome operations of a physical key type power switch is eliminated, the overall appearance of the household appliance 100 is simplified and suitable for high-end products. The brand new method of power-on and power-off is more attractive to consumers and makes the user experience more novel and more unique, which is different from that of the existing products on the market.

The First Embodiment

A control assembly is used for a household appliance 100, and the control assembly includes a control panel 2, a display screen 1 and a power switch. An accommodating groove with one open end is formed in the control panel 2, preferably, the front end of the accommodating groove is open, and the display screen 1 is located in the accommodating groove, covers the open end of the accommodating groove and can move relative to the control panel 2; the power switch is connected to the control panel 2 and/or the display screen 1 and is used for controlling the power-on and power-off of the household appliance 100; wherein when the display screen 1 is pressed, the display screen 1 moves relative to the control panel 2 and controls the power-on or power-off of the power switch.

That the power switch is connected to the control panel 2 and/or the display screen 1 means that, the arrangement position of the power switch is different depending on the type of the power switch, and it only needs to ensure that the power switch can be turned on and turned off when the display screen 1 is pressed. In one specific embodiment, the power switch is a contact switch 4, which includes a first contact 41 arranged on the display screen 1 and a second contact 42 arranged on the control panel 2 and corresponding to the first contact 41, and when the display screen 1 is pressed, the display screen 1 moves relative to the control panel 2 and drives the first contact 41 and the second contact 42 to engage or disengage each other so as to control the power-on or power-off of the power switch. In another specific embodiment, the power switch is a micro switch, which is arranged on the display screen 1 or the control panel 2.

Preferably, the control assembly further includes a rebound self-locking device 3, the rebound self-locking device 3 includes a rebound self-locking device body 31 and a clamping hook 32 capable of cooperating with the rebound self-locking device body 31, wherein the rebound self-locking device body 31 is arranged on one of the control panel 2 and the display screen 1, the clamping hook 32 is arranged on the other of the control panel 2 and the display screen 1, and when the display screen 1 is pressed, the display screen 1 moves relative to the control panel 2 and drives the rebound self-locking device body 31 to engage or disengage the clamping hook 32.

Figure 3:
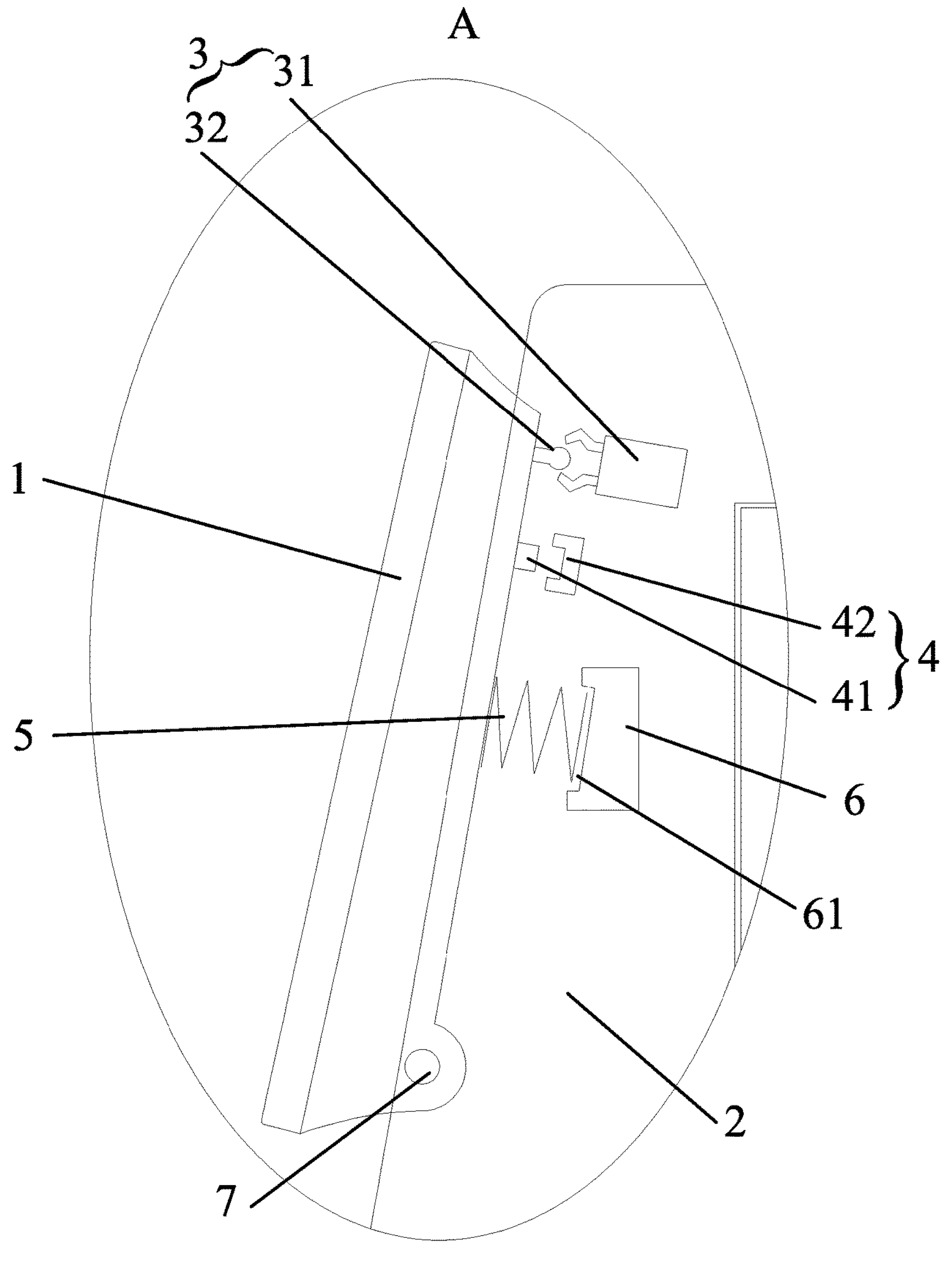
FIG. 3 is an enlarged structure diagram of a part A in FIG. 2.
Figure 5:
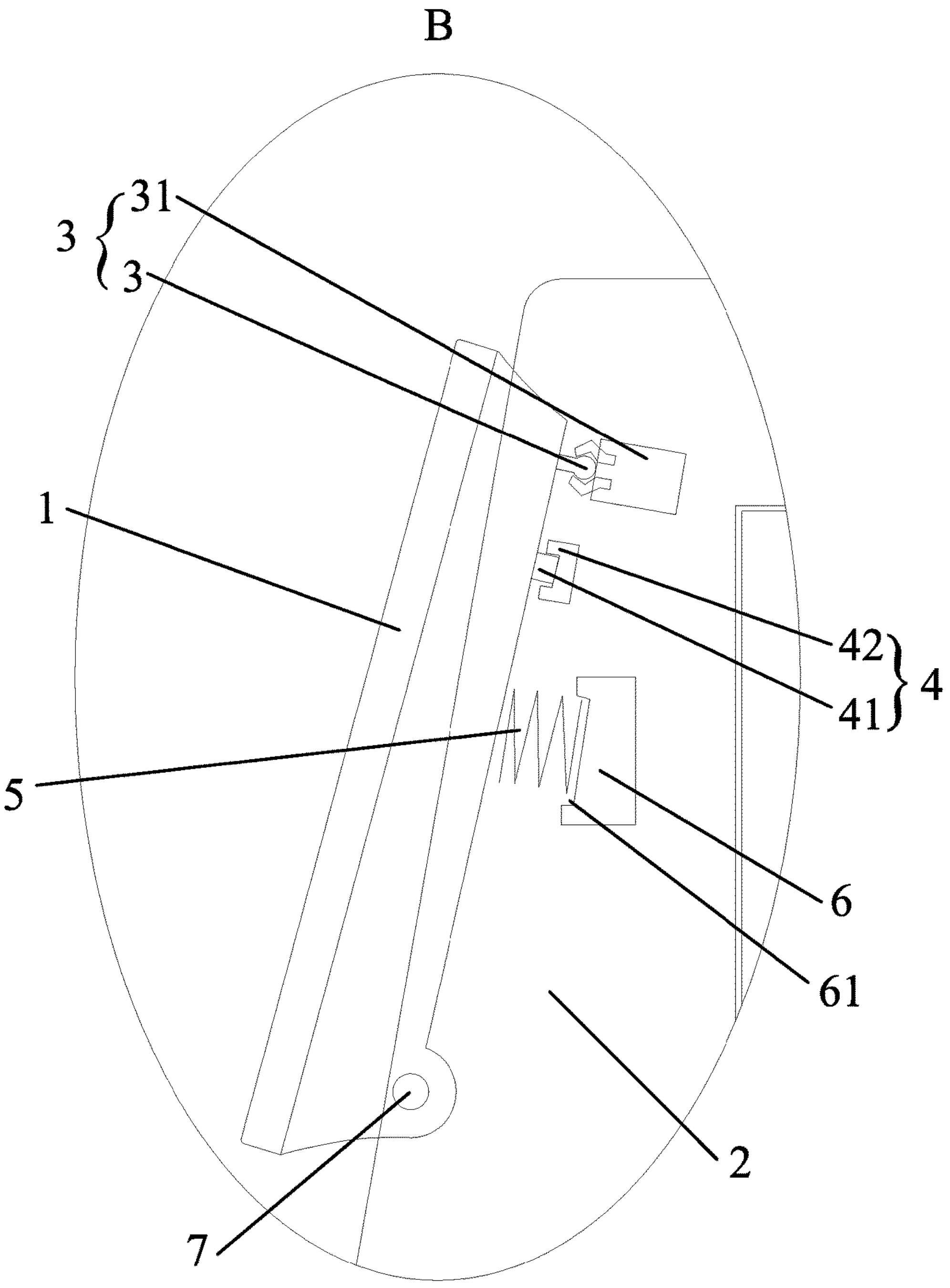
FIG. 5 is an enlarged structure diagram of a part B in FIG. 4.

As shown in FIGS. 3 and 5, the clamping hook 32 is arranged on a surface (the surface opposite to the control panel 2) of the display screen 1 close to the control panel 2, and the rebound self-locking device body 31 is arranged on a surface (the surface opposite to the display screen 1) of the control panel 2 close to the display screen 1, and the rebound self-locking device body 31 and the clamping hook 32 are correspondingly arranged, or the rebound self-locking device body 31 is arranged on the surface (the surface opposite to the control panel 2) of the display screen 1 close to the control panel 2, the clamping hook 32 is arranged on the surface (the surface opposite to the display screen 1) of the control panel 2 close to the display screen 1, and the rebound self-locking device body 31 and the clamping hook 32 are correspondingly arranged.

When the display screen 1 is pressed, preferably, when the display screen 1 is pressed toward the control panel 2, the clamping hook 32 cooperates with the rebound self-locking device body 31 to achieve the self-locking of the rebound self-locking device 3, at this time, the power switch is turned on, and when the display screen 1 is pressed again (preferably, when the display screen 1 is pressed toward the control panel 2 again), the rebound self-locking device body 31 separates from the clamping hook 32 to achieve rebound unlocking, thus driving the display screen 1 to move toward a direction opposite to the pressed direction so that the power switch is turned off.

Preferably, the display screen 1 is rotatably connected to the control panel 2.

The display screen 1 is rotatably connected to the control panel 2 through a rotating shaft 7. Specifically, the rotating shaft 7 is arranged on one of the display screen 1 and the control panel 2, a shaft hole matched with the rotating shaft 7 is formed in the other of the display screen 1 and the control panel 2, and the rotating shaft 7 is inserted into the shaft hole to achieve the rotatable connection between the display screen 1 and the control panel 2. Alternatively, a first shaft hole and a second shaft hole matched with the rotating shaft 7 are respectively formed in the display screen 1 and the control panel 2, and the rotating shaft 7 penetrates through the first shaft hole and the second shaft hole to achieve the rotatable connection between the display screen 1 and the control panel 2.

The rotatable connection mode between the display screen 1 and the control panel 2 facilitates the pressing of the user on the display screen 1, and when the display screen 1 is pressed, the display screen 1 can smoothly move relative to the control panel 2.

Preferably, the control panel 2 includes a mounting part 21, the mounting part 21 is arranged along a vertical direction or is arranged obliquely, the display screen 1 is rotatably connected to the mounting part 21, and the accommodating groove is located on the mounting part.

Preferably, a lower end or an upper end of the display screen 1 is rotatably connected to the mounting part 21.

Preferably, the household appliance 100 further includes a top cover plate 8, the top cover plate 8 is horizontally arranged and is located above the control panel 2, the control panel 2 is connected to the edge of the top cover plate 8, the mounting part 21 on the control panel 2 is vertically or obliquely arranged, and preferably, and the mounting part 21 gradually inclines toward the outside (the direction away from the axial line of the household appliance) of the household appliance 100 along a top-down direction. When the upper end of the display screen 1 is rotatably connected to the mounting part 21, the movement of the display screen 1 relative to the control panel 2 can be achieved after the lower end of the display screen 1 is pressed. Alternatively, when the lower end of the display screen 1 is rotatably connected to the mounting part 21, the movement of the display screen 1 relative to the control panel 2 can be achieved after the upper end of the display screen 1 is pressed. The press mode of pressing the upper end or the lower end of the display screen 1 satisfies the use habits of most consumers.

Of course, the mounting part 21 can also be arranged horizontally.

Preferably, when the lower end of the display screen is rotatably connected to the control panel through the rotating shaft, the power switch and the rebound self-locking device are located at the upper side of the rotating shaft, and when the upper end of the display screen is rotatably connected to the control panel through the rotating shaft, the power switch and the rebound self-locking device are located on the lower side of the rotating shaft.

Preferably, an elastic member 5 is supported between the control panel 2 and the display screen 1.

The elastic member 5 can provide a supporting force for the rebound of the display screen 1 and can also provide an elastic force ensuring a pressing stroke of the display screen 1. Specifically, when the display screen 1 is pressed, the elastic member 5 is compressed, and the rebound self-locking device achieves self-locking, and when the display screen 1 is pressed again, the rebound self-locking device 3 achieves unlocking. Since the elastic member 5 is compressed, the elastic member 5 and the rebound self-locking device 3 jointly drive the display screen 1 to reset, and when the display screen 1 is pressed, the elastic member 5 can cause the display screen 1 to move smoothly relative to the control panel 2.

Preferably, the elastic member is a spring or an elastic sheet.

In a specific embodiment, as shown in FIGS. 3 and 5, one end of the elastic member 5 is connected to the back surface of the display screen 1, a mounting seat 6 is arranged on the surface of the control panel 2 opposite to the display screen 1, the mounting seat 6 is provided with a mounting groove 61 or a mounting column thereon, the other end of the elastic member 5 is located in the mounting groove 61 or is sleeved on the mounting column, and the other end of the elastic member can also be connected to a bottom wall of the mounting groove and can also be not connected.

In another specific embodiment, one end of the elastic member 5 is connected to the control panel 2, the mounting seat is arranged on the surface of the display screen 1 opposite to the control panel 2, the mounting seat is provided with a mounting groove or a mounting column thereon, the other end of the elastic member 5 is located in the mounting groove or is sleeved on the mounting column, and the other end of the elastic member can also be connected to a bottom wall of the mounting groove and can also be not connected.

Figure 2:
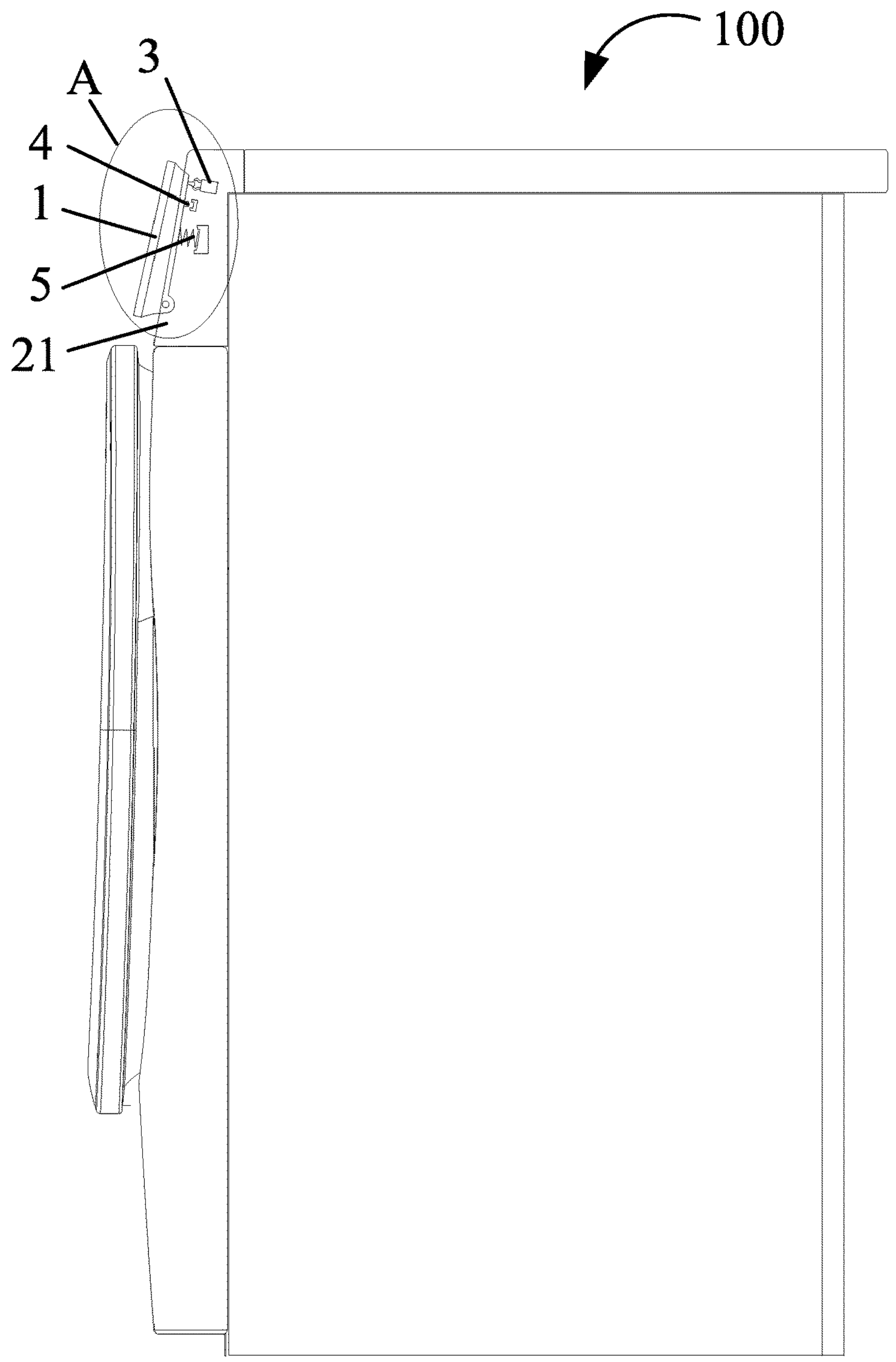
FIG. 2 is a structural schematic diagram of another view angle of the household appliance in the first embodiment of the present disclosure, wherein a rebound self-locking device is in an unlocked state and a power switch is in a turned-off state.
Figure 4:
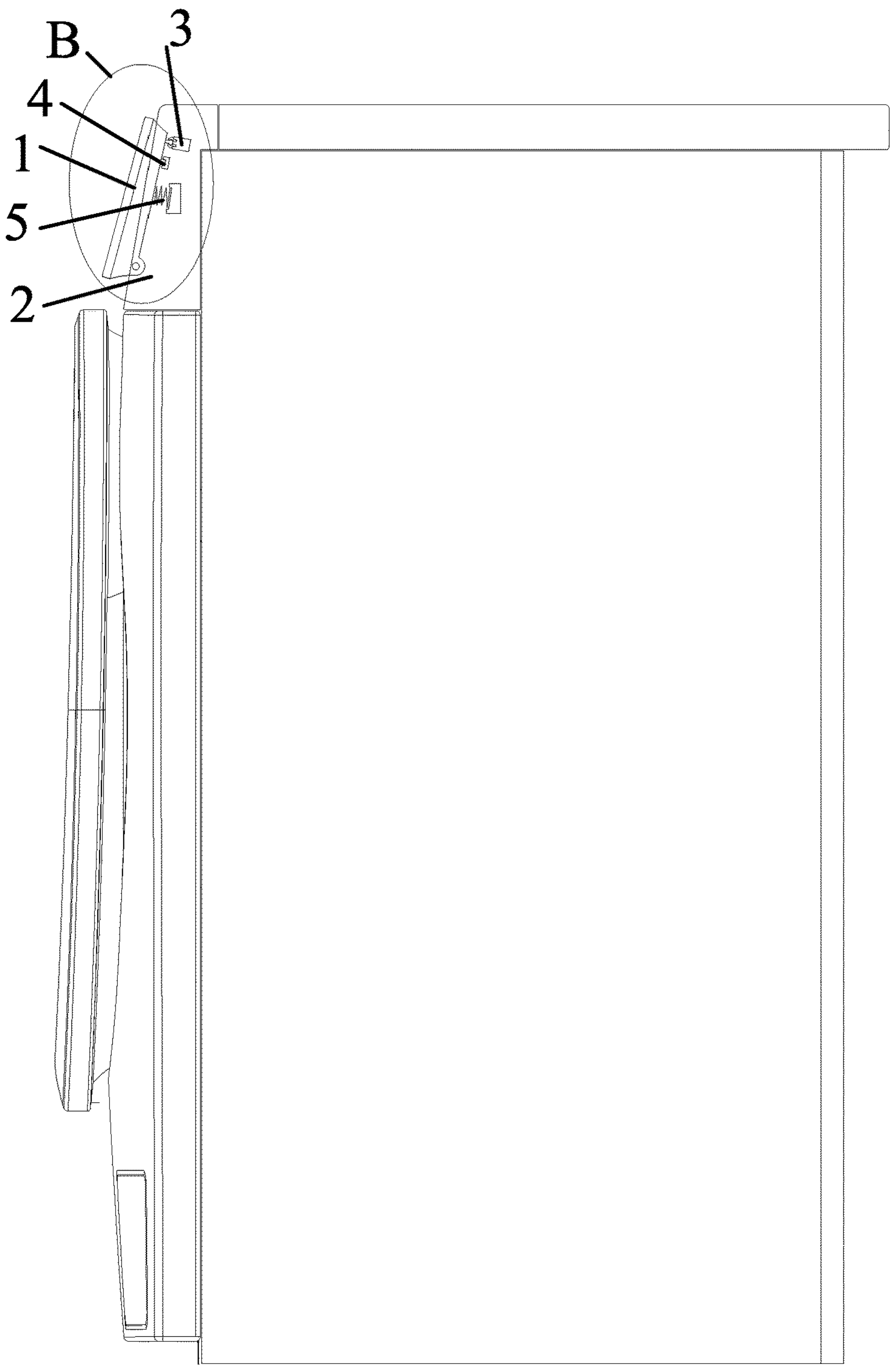
FIG. 4 is a structural schematic diagram of another view angle of the household appliance in the first embodiment of the present disclosure, wherein the rebound self-locking device is in a self-locked state and the power switch is in a turned-on state.

As shown in FIGS. 4 and 5, when the display screen 1 is pressed, the display screen 1 moves relative to the control panel 2 toward a direction (inward) close to the axial line of the household appliance 100, the first contact comes into contact with the second contact, the rebound self-locking device body cooperates with the clamping hook, the rebound self-locking device achieves self-locking, the power supply is enabled, the display screen lights up, the elastic member is compressed. And when the display screen 1 is pressed again, as shown in FIGS. 2 and 3, the rebound self-locking device 3 unlocks, the elastic member and the rebound self-locking device jointly drive the display screen 1 to move toward a direction (outward) away from the axial line of the household appliance, the display screen resets to turn off the power switch, the power supply is disabled, and the display screen is turned off.

The Second Embodiment

The difference with the first embodiment lies in that, the display screen 1 is slidably connected to the control panel 2, wherein a slide rail is arranged on the display screen 1, and a chute matched with the slide rail is formed in the control panel 2, or a chute is formed in the display screen 1, and a slide rail matched with the chute is arranged on the control panel 2.

The cooperation of the slide rail and the chute forms a guide mechanism, so that when the display screen 1 is pressed, it can move relative to the control panel 2 along the guide mechanism. When the display screen 1 is pressed, the display screen 1 moves relative to the control panel 2 toward a direction (inward) close to the axial line of the household appliance 100, the movement of the display screen 1 drives the power switch to be turned on, the power supply is enabled, the display screen lights up, the elastic device is compressed, and the rebound self-locking device 3 is driven to achieve self-locking. When the display screen 1 is pressed again, the rebound self-locking device 3 unlocks, and the elastic member and the rebound self-locking device jointly drive the display screen 1 to move outward along the guide mechanism, so that the power switch is turned off, the power supply is disabled, and the display screen is turned off.

The embodiment of the second aspect of the present disclosure provides a household appliance 100, including the control assembly described in any one of the above embodiments.

The embodiment of the second aspect of the present disclosure includes the control assembly described in the embodiment of the first aspect, thus having all beneficial effects of the control assembly described in the embodiment of the first aspect, therefore it is not described repeatedly herein.

Preferably, the household appliance 100 is a washing machine.

To sum up, in the control assembly provided by the embodiment of the present disclosure, the basic mechanism principle of the solution is similar to a wall switch, so that the power switch is combined or is directly integrated on the display screen 1, and the power-on and power-off the power supply of the household appliance 100 is achieved by pressing the display screen 1 in a manner similar to pressing a rocker switch. The clamping hook 32 on the back of the display screen 1 and the rebound self-locking device body 31 on the control panel 2 (a control board body) achieve self-locking and unlocking, the display screen 1 is pressed down to lock the rebound self-locking device 3, the display screen 1 is pressed again to realize the rebound unlocking of the rebound self-locking device 3, the elastic member 5 on the back of the screen is connected to the mounting seat 6 on the control panel 2 to provide the supporting force for the display screen 1 to rebound and ensure the elastic force of the pressing stroke of the display screen 1, and the power switch on the back of the display screen 1 can be contacted and separated when the display screen 1 is pressed down and rebounds so as to achieve the power-on and power-off of the household appliance 100.

In the description of the present disclosure, unless otherwise specified and defined, the term "plurality" means two or more than two; unless otherwise specified or indicated, the terms "connection", "fixation" and the like should be broadly interpreted, for example, the "connection" can be a fixed connection, a detachable connection, or an integral connection or an electrical connection; and it can be a direct connection or an indirect connection through an intermediary medium. Those of ordinary skill in the art can understand the specific meanings of the above terms in the present disclosure according to specific circumstances.

In the description of the present specification, it needs to be understood that the orientation or positional relationships indicated by the terms "upper", "lower", "front", "back", "left", "right" and the like are orientation or positional relationships based on the drawings, are merely for the convenience of description of the present disclosure and the simplification of the description, and do not indicate or imply that the denoted device or unit must have a particular direction or be constructed and operated in a specific orientation. Therefore, they should not be understood as limitations to the present disclosure.

In the description of the present specification, the description using the terms "one embodiment", "some embodiments", "a specific embodiment" and the like means that specific features, structures, materials or characteristics described in conjunction with the embodiment or example are included in at least one embodiment or example of the present disclosure. In the present specification, the schematic representation of the above terms does not necessarily refer to the same embodiment or example. Moreover, the specific features, structures, materials or characteristics described can be combined in any suitable manner in one or more embodiments or examples.

Described above are merely preferred embodiments of the present disclosure, which are not intended to limit the present disclosure. For those skilled in the art, the present disclosure can have various changes and modifications. Any modifications, equivalent replacements, improvements and the like made within the spirit and principle of the present disclosure shall fall within the protection scope of the present disclosure.

What is claimed is:

1. A washing machine control assembly, comprising:

a control panel;

a display screen arranged on the control panel and capable of moving relative to the control panel;

a power switch connected to the control panel and/or the display screen and configured to control the power-on and power-off of the washing machine; and a rebound self-locking device comprising a rebound self-locking device body and a clamping hook capable of engaging the rebound self-locking device body, wherein the rebound self-locking device body is arranged on one of the control panel and the display screen, the clamping hook is arranged on the other of the control panel and the display screen, and when the display screen is pressed, the display screen moves relative to the control panel and drives the rebound self-locking device body to engage or disengage the clamping hook;

wherein when the display screen is pressed, the display screen moves relative to the control panel and controls the power-on or power-off of the power switch.

2. The washing machine control assembly according to claim 1, wherein the display screen is rotatably connected to the control panel.

3. The washing machine control assembly according to claim 2, wherein the control panel comprises a mounting part, the mounting part is arranged along a vertical direction or is arranged obliquely, and the display screen is rotatably connected to the mounting part.

4. The washing machine control assembly according to claim 3, wherein a lower end or an upper end of the display screen is rotatably connected to the mounting part.

5. The washing machine control assembly according to claim 1, wherein the display screen is rotatably connected to the control panel.

6. The washing machine control assembly according to claim 5, wherein the control panel comprises a mounting part, the mounting part is arranged along a vertical direction or is arranged obliquely, and the display screen is rotatably connected to the mounting part.

7. The washing machine control assembly according to claim 6, wherein a lower end or an upper end of the display screen is rotatably connected to the mounting part.

8. The washing machine control assembly according to claim 1, wherein the display screen is slidably connected to the control panel, a chute is formed in the display screen, and a slide rail matched with the chute is arranged on the control panel.

9. The washing machine control assembly according to claim 1, wherein an elastic member is supported between the control panel and the display screen.

10. The washing machine control assembly according to claim 9, wherein one end of the elastic member is connected to the display screen, a mounting seat is arranged on a surface of the control panel opposite to the display screen, the mounting seat is provided with a mounting groove or a mounting column thereon, and the other end of the elastic member is located in the mounting groove or is sleeved on the mounting column.

11. The washing machine control assembly according to claim 9, wherein one end of the elastic member is connected to the control panel, the mounting seat is arranged on a surface of the display screen opposite to the control panel, the mounting seat is provided with a mounting groove or a mounting column thereon, and the other end of the elastic member is located in the mounting groove or is sleeved on the mounting column.

12. The washing machine control assembly according to claim 1, wherein an elastic member is supported between the control panel and the display screen.

13. The washing machine control assembly according to claim 1, wherein the power switch is a contact switch, which comprises a first contact arranged on the display screen and a second contact arranged on the control panel and corresponding to the first contact, and when the display screen is pressed, the display screen moves relative to the control panel and drives the first contact and the second contact to engage or disengage each other so as to control the power-on or power-off of the power switch.

14. The washing machine control assembly according to claim 1, wherein the power switch is a micro switch, which is arranged on the display screen or the control panel; and an accommodating groove with one open end is formed in the control panel, and the display screen is located in the accommodating groove and covers the open end of the accommodating groove.

15. A washing machine, comprising:

a control assembly which comprises a control panel;

a display screen arranged on the control panel and capable of moving relative to the control panel; and a power switch connected to the control panel and/or the display screen for controlling the power-on and power-off of the washing machine;

wherein when the display screen is pressed, the display screen moves relative to the control panel and controls the power-on or power-off of the power switch, wherein the control assembly further comprises a rebound self-locking device comprising a rebound self-locking device body and a clamping hook capable of engaging the rebound self-locking device body, wherein the rebound self-locking device body is arranged on one of the control panel and the display screen, the clamping hook is arranged on the other of the control panel and the display screen, and when the display screen is pressed, the display screen moves relative to the control panel and drives the rebound self-locking device body to engage or disengage the clamping hook.

16. The washing machine according to claim 15, wherein the display screen is rotatably connected to the control panel.

* * * * *